US005701097A

United States Patent [19]

Fisher et al.

[11] Patent Number: 5,701,097

[45] Date of Patent: Dec. 23, 1997

[54] STATISTICALLY BASED CURRENT GENERATOR CIRCUIT

[75] Inventors: Gregory J. Fisher, Indialantic; Chong I. Chi, Palm Bay, both of Fla.

[73] Assignee: Harris Corporation, Melbourne, Fla.

[21] Appl. No.: 515,435

[22] Filed: Aug. 15, 1995

[51] Int. Cl.$^6$ ........................ H03K 17/14

[52] U.S. Cl. ........................ 327/538; 327/103; 327/362

[58] Field of Search ........................ 327/530, 38, 103, 327/362

[56] References Cited

U.S. PATENT DOCUMENTS

| | | | |
|---|---|---|---|
| 4,008,417 | 2/1977 | Donovan | 361/53 |
| 4,250,445 | 2/1981 | Brokaw | 323/313 |
| 4,398,207 | 8/1983 | Hoff, Jr. et al. | 357/51 |
| 4,588,959 | 5/1986 | Herzog et al. | 330/149 |
| 4,591,781 | 5/1986 | Larson | 323/323 |
| 4,853,646 | 8/1989 | Johnson et al. | 330/256 |
| 4,864,162 | 9/1989 | Maoz | 327/530 |
| 5,045,717 | 9/1991 | Moen, Jr. et al. | 327/530 |
| 5,081,380 | 1/1992 | Chen | 307/591 |
| 5,130,577 | 7/1992 | Neidorff et al. | 327/103 |
| 5,144,405 | 9/1992 | Naber | 327/362 |
| 5,231,316 | 7/1993 | Tholen, Jr. | 327/103 |
| 5,258,702 | 11/1993 | Conzelmann et al. | 323/313 |
| 5,287,054 | 2/1994 | Llewellyn | 323/314 |
| 5,291,122 | 3/1994 | Audy | 323/313 |
| 5,367,249 | 11/1994 | Honnigford | 323/313 |
| 5,448,103 | 9/1995 | De Wit | 257/536 |

OTHER PUBLICATIONS

Gray et al., *Analysis and Design of Analog Integrated Circuits, 3d Edition*, (1993) pp. 134–136, 1624–1625.

Wai-Kai Chen, *The Circuits and Filters Handbook*, "Voltage and Current References and Bias Circuits", (1995) pp. 1683–1699, and 2096.

Fink et al., *Electronics Engineer' Handbook*, "Integrated Circuits and Microprocessors" (1982) pp. 846–851.

*Primary Examiner*—Timothy P. Callahan
*Assistant Examiner*—Eunja Shin
*Attorney, Agent, or Firm*—Allen, Dyer, Doppelt, Milbrath & Gilchrist, P.A.

[57] ABSTRACT

The invention is a circuit and method for selecting a plurality of different types of resisters and for reliably manufacturing a current generator across different wafer lots. In one embodiment, a monolithic current generator applies the output voltage of a voltage reference circuit across a plurality of series-connected resisters of different types. The resisters are preferably statistically independent resisters, which permits a total resistance with a predefined standard resistance deviation across manufacturing wafer lots. An output current may then be produced which has a predefined standard current deviation across manufacturing wafer lots. In a preferred embodiment, no more than six different types of resisters are used. The resisters may be chosen from the group consisting of diffused resisters, implanted resisters, thin film resisters, metal resisters, and composite resisters. The present invention also includes a method for reliably producing current generators across wafer lots. A plurality of voltage reference circuits are formed in electrical connection with a plurality of n different types of series-connected resisters in a plurality of semiconductor die. Preferably, the plurality of n statistically independent resisters are formed with each resistor of the plurality of statistically independent resisters having a predefined standard resistance deviation across manufacturing wafer lots. An output voltage from respective ones of the voltage reference circuits applied across respective ones of the plurality of n different types of resisters would produce a plurality of respective output currents. Each of the respective output currents preferably has a predefined standard current deviation across manufacturing wafer lots.

25 Claims, 2 Drawing Sheets

STATISTICALLY BASED CURRENT GENERATOR CIRCUIT

FIELD OF THE INVENTION

This invention relates to the field of current generation. More particularly, this invention relates to currents which can be reliably generated by circuits that are manufactured in different wafer lots.

BACKGROUND OF THE INVENTION

The process of manufacturing semiconductors, or integrated circuits (commonly called ICs or chips), typically consists of more than a hundred steps during which hundreds of copies of an integrated circuit are formed on a single semiconductor wafer. Wafers are usually processed in lots of up to approximately 40 wafers. Generally, the process involves the creation of eight to twenty patterned layers on and into a silicon wafer substrate, ultimately forming the complete integrated circuit. This layering process creates electrically active regions in and on the semiconductor wafer surface.

The fabrication process involves a complex series of operations, including oxidation, masking, etching, doping, dielectric deposition, metallization, and passivation. In doping, atoms with one less electron than silicon (such as boron), or one more electron than silicon (such as phosphorous), are introduced into the area exposed by the etch process to alter the electrical character of the silicon. In other words, selected chemical impurities (dopants) are introduced into portions of the crystal structure of the semiconductor wafer to modify its electrical properties. These areas are referred to as P-type (boron) or N-type (phosphorous) to indicate their conducting characteristics. Doping concentrations generally range from a few parts per billion (for resistive semiconductor regions) to a fraction of a percent (for highly conductive regions).

Diffusion, for example, is a high temperature doping process in which chemical impurities enter and move through the crystalline lattice structure of a semiconductor material to change its electrical characteristics. The process takes place in a diffusion furnace, typically at temperatures between 850° C. and 1150° C. Ion implantation is another method for adding dopants to semiconductor regions. Charged atoms (ions) of elements such as boron, phosphorous, or arsenic are accelerated by an electric field into the semiconductor material, which is especially useful for very shallow (<1 μm) distributions of dopants in a semiconductor. Ion implantation is usually performed at room temperature, with the resulting implantation-induced lattice damage removed by annealing at temperatures of approximately 700° C. Ion implantation is generally a more precise method than diffusion doping.

As suggested by its complexity, the manufacturing of integrated circuits is very tightly controlled in any individual wafer fabrication facility (wafer FAB). Each wafer FAB has complicated and detailed "ground rules" for each process. To make an IC, a wafer FAB requires a technical "transfer package" that includes not only the specific circuit topologies embedded in the patterns of masks used in photoresist steps, but also includes the detailed technical know-how of the process steps necessary to make that specific IC. Even with tremendous detail, however, it is often difficult to reliably reproduce the same integrated circuits across different wafer lots. Not only is there variability between wafer lots, but variability will occur within a single wafer lot.

Accordingly, quite a bit of process variability takes place in the production of the same integrated circuit between different wafer lots and between different wafers in the same lot. The manufacturing of resistors within an IC is one specific area that is prone to its own challenges between different wafers and wafer lots. The "same" resistor may have quite different variations within a wafer lot and from one wafer lot to another. As a practical matter, a design engineer must simulate a circuit design at both tolerance extremes to ensure that the design will work when it is implemented in an integrated circuit. A sample of tolerance ranges for different resistor types, listed in the table below, illustrates the variety of tolerance extremes.

| Resistor Type | Absolute Tolerance (%) |
|---|---|
| Base diffused | +20 |
| Emitter diffused | ±20 |
| Ion implanted | ±3 |
| Base pinch | ±50 |
| Epitaxial | ±30 |
| Epitaxial pinch | ±50 |
| Thin film | ±5–±10 |

For more information on the typical properties of semiconductor resistors, See, Wai-Kai Chen, *The Circuits and Filters Handbook*, 1571–1583 (CRC Press) (1995), the contents of which is hereby incorporated by reference.

Although manufacturing precision for a particular resistor may be somewhat limited, the actual variation in a current generated using that resistor may be quite narrow. However, the current may fluctuate around different center points from wafer to wafer. To accommodate various fluctuations around various center points, a designer should design a circuit which can accommodate variations around the likely grouping of center points.

In the design of integrated circuits, such as amplifiers or voltage regulators, it is often necessary to establish an internal voltage reference in the circuit. For example, a typical current generator applies the output voltage of a voltage reference circuit across a resistor to generate a current. Thus, resistors are key elements in current generators. However, in different wafers or wafer lots this might result in quite different resistances, and therefore, quite different current outputs. Although this dilemma is partially addressed by the internal matching that is usually present in semiconductor manufacturing, each device being offset by the same amount, there are still difficulties associated with manufacturing a resistor to a specific absolute value. Accordingly, there is a need for reproducible and predictable manufacturing of resistors across different semiconductor wafers and wafer lots.

SUMMARY OF THE INVENTION

It is therefore an object of the present invention to provide a circuit and method of manufacturing a current generator which can be reliably manufactured across different wafer lots.

It is yet another object of the present invention to provide a circuit and method for producing a current generator having an output current with a predefined standard deviation of current across manufacturing wafer lots.

These and other objects of the present invention are achieved by a monolithic current generator which applies the output voltage of a voltage reference circuit across a plurality of series-connected resistors of different types. The resistors are preferably statistically independent resistors, which permits a total resistance with a predefined standard resistance deviation across manufacturing wafer lots. The term "standard resistance deviation" is used to express the standard deviation of resistance. Thus, with a resistor ladder electrically connected to a voltage reference circuit, such that the output voltage is applied across the series-connected resistors, an output current is produced which has a predefined standard current deviation across manufacturing wafer lots. The term "standard current deviation" is used to express the standard deviation of current. The predefined standard current deviation is dependent on the predefined standard resistance deviation. In a preferred embodiment, no more than six different types of resistors are used. The resistors may be chosen from the group consisting of diffused resistors, implanted resistors, thin film resistors, metal resistors, and composite resistors.

In a second embodiment, an integrated circuit has an internal circuit with a signal input, a signal output, and a bias current input. The signal output is responsive to an input signal at the signal input and a bias current at the bias current input. The output voltage of a voltage reference circuit is electrically connected to a resistor ladder having a plurality of statistically independent resistors electrically connected in series. The statistically independent resistors have a total resistance and a predefined standard resistance deviation across manufacturing wafer lots. The resistor ladder is electrically connected to the voltage reference circuit and the internal circuit such that the output voltage is applied across the resistor ladder which thereby produces the bias current, with the bias current provided to the bias current input. The bias current has a predefined standard current deviation across manufacturing wafer lots which is dependent on the predefined standard resistance deviation.

In a third embodiment, a monolithic current generator utilizes a voltage reference circuit which is electrically connected to a resistor ladder so that the output voltage is applied across the resistor ladder to produce an output current. In the third embodiment, the resistor ladder has n statistically independent resistors electrically connected in series, each of the plurality of statistically independent resistors selected according to:

$$\frac{\sigma_T}{r_T}=\sqrt{\sum_{i=1}^{n}\left(\frac{1}{x_i}\right)^2\left(\frac{\sigma_i}{r_i}\right)^2}$$

where $r_T$=total resistance of the resistor ladder;

$\sigma_T$=standard deviation of the total resistance, $r_T$, of the resistor ladder across manufacturing wafer lots;

$x_i$=a number greater than one which represents the value of each resistor, $r_i$, as some fraction of the total resistance;

$\sigma_i$=standard deviation of the ith resistor, $r_i$, in the resistor ladder across manufacturing wafer lots; and where the value of each resistor, $r_i$,=$r_T/x_i$. In some cases, the variables $x_i$–$x_n$ may all equal a single number greater than one.

The present invention also contemplates a method for ensuring reproducible and accurate current outputs in current generators manufactured in different wafer lots. After providing a semiconductor wafer having a plurality of semiconductor die, a plurality of voltage reference circuits are formed in respective ones of the plurality of semiconductor die. A respective plurality of n different types of resistors electrically connected in series for each of the respective plurality of voltage reference circuits are also formed in respective ones of the plurality of semiconductor die. Preferably, the plurality of n statistically independent resistors are formed with each resistor of the plurality of statistically independent resistors having a predefined standard resistance deviation across manufacturing wafer lots. Thus, the plurality of n statistically independent resistors has a total resistance with a predefined standard resistance deviation across manufacturing wafer lots.

Electrical connections are then formed between each of the plurality of voltage reference circuits and each of the plurality of n different types of resistors. Accordingly, an output voltage from respective ones of the voltage reference circuits applied across each of the respective plurality of n different types of resistors would produce a plurality of respective output currents. The method may include the step of providing an output voltage from respective ones of the voltage reference circuits across each of the respective plurality of n different types of resistors to produce a plurality of respective output currents. Each of the respective output currents preferably has a predefined standard current deviation across manufacturing wafer lots.

The present invention thus provides a circuit and method for selecting a plurality of statistically independent resistors and for manufacturing a current generator which can be reliably manufactured across different wafer lots. Using statistically independent resistors ensures that the resulting total resistance has a predefined standard resistance deviation across manufacturing wafer lots. Thus, a current generator taking advantage of the invention will have an output current with a predefined standard current deviation across manufacturing wafer lots.

DESCRIPTION OF THE PREFERRED EMBODIMENTS

Figure 1:
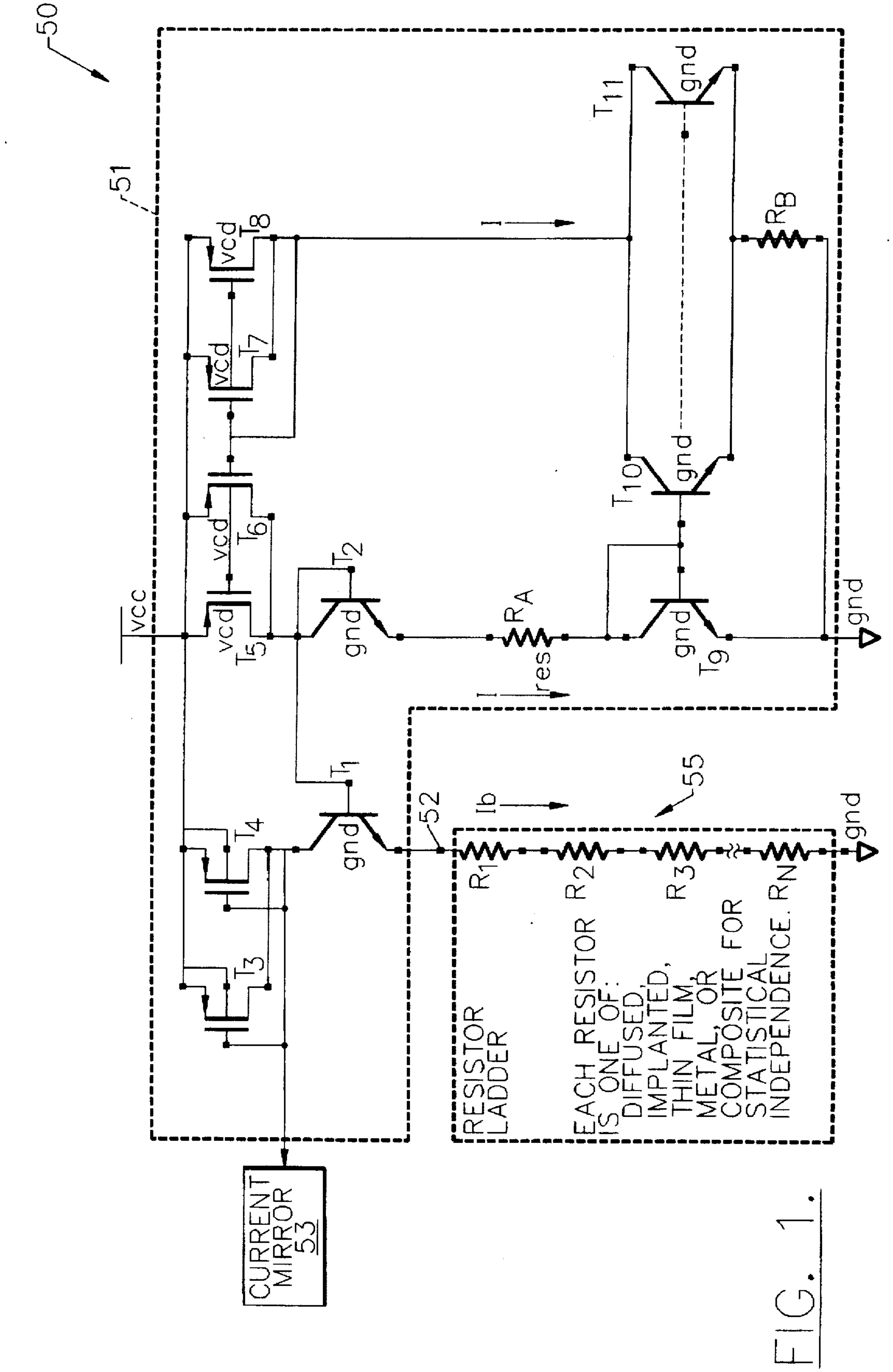
FIG. 1 illustrates a current generator according to a first embodiment of the invention.

The present invention now will be described more fully with reference to the accompanying drawings, in which the preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Figure 2:
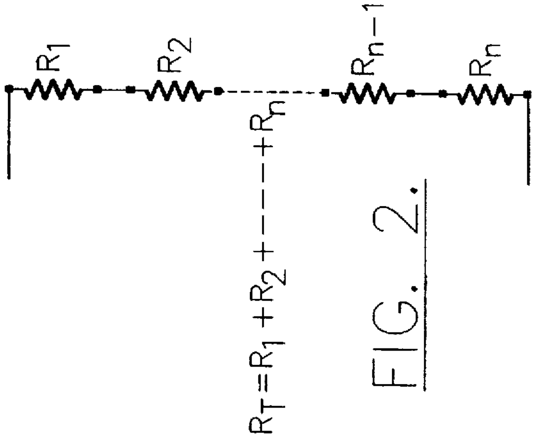
FIG. 2 illustrates a resistor ladder according to the invention.

The invention is a circuit and method for selecting a plurality of different types of resistors and for reliably manufacturing a current generator across different wafer lots. In a first embodiment, illustrated in FIG. 1, a monolithic current generator, referred to generally as 50, applies an output voltage of a voltage reference circuit 51, at node 52, across a plurality of series-connected resistors $R_1$, $R_2$, $R_3$–$R_N$, of different types. The resistors $R_1$–$R_N$, illustrated in FIG. 2, are preferably statistically independent resistors, which permits a total resistance $R_T$ with a predefined standard resistance deviation, $\sigma_T$, across manufacturing wafer lots. The current generator 50 uses several different types of resistors, $R_1$, $R_2$, $R_3$–$R_N$, to yield the desired result. The different types of resistors, $R_1$, $R_2$, $R_3$–$R_N$, are specifically chosen to be of different construction and to have different electrical characteristics. The resistor types are chosen such that each resistor's value in ohms will be statistically uncorrelated to values of the other resistors. The array of resistors $R_1$–$R_N$ determines the statistical properties of the current by the number, type, and value of the resistors used. An output current, $I_b$, may then be produced which has a predefined standard current deviation across manufacturing wafer lots.

In a preferred embodiment, no more than six different types of resistors are used. As will be discussed in more detail below, the additional benefits conferred does not usually warrant using more than six resistors of different types. The resistors, $R_1$–$R_N$, may be chosen from the group consisting of diffused resistors, implanted resistors, thin film resistors, metal resistors, and composite resistors.

In silicon bipolar technology, layers which may be available for diffused resistor formation include base layer diffusion, emitter layer diffusion, active base region diffusion, and epitaxial layer diffusion. A typical diffused resistor might use an N-type collector well as a substrate with the diffused resistor formed by using a P-type base diffusion of NPN transistors. Emitter-diffused resistors may be formed by using a heavily doped n+ emitter diffusion layer of NPN transistors. In MOS (metal-oxide-semiconductor) technology, a diffused layer forming the source and drain of the MOS transistors can be used to form a diffused resistor.

Commonly used thin-film resistors include tantalum, nickel-chromium (Ni-Cr), cermet (Cr-SiO), and tin oxide ($SnO_2$), any of which may be deposited on top of a thermally grown silicon dioxide, $SiO_2$, layer. An active base region of an NPN transistor can be used to construct pinched resistors with typical sheet resistance ranges from 2 to 10 KΩ. The P-type resistor body is "pinched" between an N+ diffusion layer and an N-type epitaxial layer. Epitaxial resistors may be formed by lightly doping an epitaxial layer.

Resistors can be N-type, P-type implanted and/or diffused. Composite resistors can incorporate features of two different types of the above mentioned resistors. For example, one resistor may implanted, and another implanted resistor may be used with different doping values to achieve the desired results. Alternatively, a composite diffused resistor may be used with another composite diffused resistor which has had an additional implant. There can be great variety in specific resistors, the key is that the different resistors must have reasonably uncorrelated statistical properties.

All of the above mentioned resistors, and the process for their manufacture, are well known to those with skill in the art. Although the various types of resistors are well known, the inventors have recognized that there are significant advantages in combining statistically independent resistors of different types. Each of these resistors can be made in the HBC-10 process of Harris Corporation's Semiconductor Sector. The HBC-10 process is a BiCMOS mixed-signal wafer process developed to provide high integration of logic as well as precision analog capability. Harris Semiconductor makes a wide variety of commercial and military semiconductor products, as well as Application Specific Integrated Circuits (ASICs) for customers.

Referring again to FIG. 1, the current $I_b$ is generated by applying a voltage from the voltage reference circuit 51 across an array of resistors $R_1$–$R_N$ having values which are statistically independent of each other. The illustrated voltage reference circuit 51 is a well-known bandgap voltage reference and uses transistors $T_1$–$T_{11}$. However, any other of the many voltage reference circuits known to those with skill in the art may be used instead of a bandgap voltage reference circuit 51. For more information on voltage reference sources, See Donald G. Fink, *Electronics Engineers' Handbook*, 8–46-8–51 (McGraw-Hill) (1982), and Wai-Kai Chen, *The Circuits and Filters Handbook*, 1619–1698 (CRC Press)(1995), the contents of which are hereby incorporated by reference.

In the voltage reference circuit 51, MOS transistor pairs T5, T6 and T7, T8 mirror the current I such that the current flowing into bipolar transistor T9 is equal to the current flowing into the transistor array T10–T11. This, along with the difference in the emitter areas of T9 and the transistor array T10–T11, and the presence of the resistor $R_B$, causes the current I to have a defined temperature dependence. The current I flowing through resistor $R_A$ generates a voltage which appears at the emitter of T2. The voltage appearing at the emitter of T2 can be caused to be independent of temperature by choosing the correct combination of $R_A$, $R_B$ and transistor sizes in the transistor array T10–T11. This voltage, either temperature independent or with a defined temperature dependence, is replicated at the emitter of T1 by the common base connection of T1 and T2. The voltage at the emitter of T1 then appears across the resistor ladder 55 which generates a current, $I_b$, that is dependent on the voltage and resistance values.

In a preferred embodiment, the generated current, $I_b$, is mirrored by current mirror 53 and can be used as a master bias current. Current mirror 53 may take on a number of forms including one or more MOS transistors similar to T3, T4. MOS devices T3 and T4 are used in this embodiment to generate a gate to source voltage which is dependent on the drain current $I_b$. The gate to source voltage is used by the current mirror 53 to generate additional currents, identical to $I_b$, which can be connected to additional internal circuitry, not shown.

As an example, the invention was used as a bias circuit in the HI5714, a Harris Semiconductor 8 bit video A/D converter. Four resistors were electrically connected in series to derive a current having a value inversely proportional to NiChrome sheet resistance. The standard deviation of the current, $\sigma_I$, was set at 60% of the standard deflation of the NiChrome sheet resistance. The relationship in current and sheet resistance was established to satisfy conflicting requirements on current variations and voltage swing levels. Four different, and reasonably statistically independent, resistor types were used: Poly1, Pbase, P+, and NiChrome. The respective standard deviations were: Poly 1=11.5%, Pbase=8.3%, P+=10.0%, NiCr32 8.9%. In this example, the NiChrome resistor value was set to half the total resistance while the other resistors were each set to ⅙ of the total. Simulation results revealed an inverse relationship between the current $I_b$ and the NiChrome resistor value. The NiChrome resistor value had a standard deviation of 8.9%, and the resulting bias current had a standard deviation of 5.5%. Test results from two different wafer lots had current and resistance values that were in accord with the simulation results.

A second application of the invention was used in the HI5805 and two derivative products. The HI5805 is a Harris Semiconductor 12 bit, 5 Msample/sec converter. The invention was used to stabilize a master bias current without resorting to a laser trim based circuit or a complex precision circuit. The use of the current generator circuit 50 allowed an area efficient realization while requiring only a modest design effort. Circuit simulations showed the bias current as having a standard deviation of 4.2% over process, temperature, and supply voltage variations. This 4.2% standard deviation is less than the standard deviations of any one of the individual resistors, which had standard deviations from 12% to 23%.

The resistors $R_1$–$R_n$, used to form a total resistance value $R_T$, can be thought of as random variables, each with a mean and variance, where i goes from 1 to n:

$$\text{Mean: } E[R_i] = r_i \text{ Variance: } V[R_i] = \sigma_i^2$$

The mean of the sum of the resistors is given by $$E[R_T] = r_T = \sum_i E[R_i] = \sum_i r_i$$

Since the desired value of the sum is known, the value of each of the resistors may be set to:

$$r_i = \frac{r_T}{x_i} \text{ where } x_i > 1.0$$

If the resistor values are statistically independent of each other, then the variance of $R_T$ is:

$$\sigma^2_T = \sigma^2_1 + \sigma^2_2 + \ldots + \sigma^2_n$$

Now, expressing the standard deviations in terms of a ratio relative to the mean value of each resistor gives:

$$\sigma_i = \frac{\sigma_i}{r_i} r_i = \left(\frac{\sigma_i}{r_i}\right)\left(\frac{r_T}{x_i}\right)$$

The variance of $R_T$ can be written as:

$$\sigma_T^2 = \sum_{i=1}^{n}\left(\frac{\sigma_i}{r_i}\right)^2\left(\frac{r_T}{x_i}\right)^2 = r_T^2\left[\sum_{i=1}^{n}\left(\frac{1}{x_i}\right)^2\left(\frac{\sigma_i}{r_i}\right)^2\right]$$

Forming the ratio of the standard deviation of $R_T$ to its mean gives:

$$\frac{\sigma_T}{r_T} = \sqrt{\sum_{i=1}^{n}\left(\frac{1}{x_i}\right)^2\left(\frac{\sigma_i}{r_i}\right)^2}$$

Although difficult to see from this generalized equation, the standard deviation of $R_T$ tends to be reduced to a level less than or equal to that of any of the individual resistors $R_i$.

In one special case, $x_i$=n; so $r_i$=$r_T$/n, and all the resisters are equal in value. The ratio of the standard deviation to the mean simplifies to:

$$\frac{\sigma_T}{r_T} = \frac{1}{n}\sqrt{\sum_{i=1}^{n}\left(\frac{\sigma_i}{r_i}\right)^2}$$

In other words, when $x_i$, which represents the value of each resistor, $r_i$, as some fraction of the total resistance, equals a fixed number, the resistors have equal value. For example, if $x_i$ equals 4, then the resistors have equal value, each being equal to 25% of the total resistance $R_T$.

In another special case, if the standard deviations for each resistor, $\sigma_i$, are all approximately equal, then:

$$\frac{\sigma_T}{r_T} = \sqrt{\frac{1}{n}}\left(\frac{\sigma_i}{r_i}\right)$$

From this expression, it is seen that the standard deviation to mean ratio is reduced by the square root of the number of independent resistors used.

Those with skill in the art realize that practical resistors do not generally have equal standard deviations, nor are the values totally independent. In addition, the number of independent resistors available in any one manufacturing process is limited. In spite of these limitations, and depending on the process used, there are enough different types of reasonably independent resistors with approximately equal standard deviations for this technique to be useful.

Figure 3:
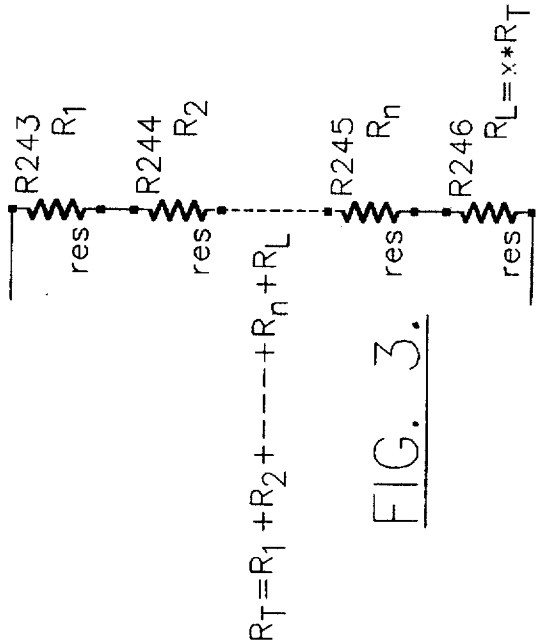
FIG. 3 illustrates a second embodiment of a resistor ladder according to the invention.

Another embodiment of the present invention modifies the resistor ladder such that the derived current $I_b$ has a standard deviation related to one of the resistors. In this case, there are n equal valued resistors $R_1$ to $R_n$ and one additional resistor $R_L$, as shown in FIG. 3. The L subscript suggests that $R_L$ may be a load resistor used elsewhere in another functional block.

The resistors $R_1$–$R_n$ and $R_L$ can again be thought of as random variables, each with a mean and variance, where i goes from 1 to n:

$$\text{Mean: } E[R_i] = r_i \text{ Variance: } V[R_i] = \sigma_i^2$$

$$\text{Mean: } E[R_L] = r_L \text{ Variance: } V[R_i] = \sigma_L^2$$

The mean of the sum of the resistors is given by:

$$E[R_T] = r_T = \sum_i (r_i) + r_L$$

If $R_L$ is set to some fraction x of the total desired resistance $R_T$, where x is between 0 and 1, then the values of the resistors are:

$$R_L = xR_T \text{ and}$$

$$r_i = \frac{R_T - R_L}{n} = \frac{(1-x)R_T}{n}$$

Assuming independence, the variance of $R_T$ is:

$$\sigma^2_T = \sigma^2_1 + \sigma^2_2 + \ldots + \sigma^2_n + \sigma^2_L$$

By writing the standard deviations as:

$$\sigma_i = \frac{\sigma_i}{r_i} r_i = \left(\frac{\sigma_i}{r_i}\right)\left(\frac{(1-x)r_T}{n}\right) \text{ and}$$

$$\sigma_L = \frac{\sigma_L}{r_L} r_L = \left(\frac{\sigma_L}{r_L}\right)(xr_T)$$

The variance of $R_T$ can be described as:

$$\sigma_T^2 = r_T^2\left[\sum_i\left(\frac{\sigma_i}{r_i}\cdot\frac{1-x}{n}\right)^2 + \left(\frac{\sigma_L}{r_L}x\right)^2\right]$$

Forming the ratio of the standard deviation of $R_T$ to its mean gives:

$$\frac{\sigma_T}{r_T}=\sqrt{\left[\sum_i\left(\frac{\sigma_i}{r_i}\cdot\frac{1-x}{n}\right)^2+\left(\frac{\sigma_L}{r_L}x\right)^2\right]}$$

Considering the special case when all resistors, $R_1$–$R_n$ and $R_L$, have equal standard deviations, then the ratio of sigma to the mean reduces to:

$$\frac{\sigma_T}{r_T}=\frac{\sigma_i}{r_i}\sqrt{\frac{(1-x)^2}{n}+x^2}$$

As n increases, the ratio becomes:

$$\frac{\sigma_{R_T}}{r_T}=\frac{\sigma_i}{r_i}x$$

Thus, by choosing n and the factor x (between 0 and 1), the total resistance, $R_T$, and the derived current, $I_b$, can be made to have a standard deviation which is a linear fraction of the standard deviation of the resistor $R_L$. In the case of the HI5714 8 bit A/D converter, this feature was used to solve conflicting requirements arising from product specifications. The following table illustrates the dependence of the ratio of the total resistance standard deviation to the individual resistor standard deviation for a value of x of 0.5 and several values of n.

Number of Elements vs. Standard Deviation Ratio

| x | n | $100\%\frac{(\sigma_T/r_T)}{(\sigma_i/r_i)}$ |
|---|---|---|
| ½ | 1 | 70% |
| ½ | 2 | 61% |
| ½ | 3 | 58% |
| ½ | 4 | 56% |
| ½ | 5 | 55% |

The table below illustrates the dependence of the ratio of the total resistance standard deviation to the individual resistor standard deviation for the generic case.

Table of $\frac{\sigma_T}{r_T}=\sqrt{\frac{1}{n}}\frac{\sigma_i}{r_i}$

| n | $100\%\frac{(\sigma_T/r_T)}{(\sigma_i/r_i)}$ |
|---|---|
| 1 | 100% |
| 2 | 71% |
| 3 | 58% |
| 4 | 50% |
| 5 | 45% |
| 6 | 41% |
| 7 | 38% |
| 8 | 35% |

From the preceding table, it can be seen that after about the sixth resistor, there may be a diminishing return point at which additional resistors do not add enough value to merit their inclusion. Thus, in a preferred embodiment, no more than six resistors are used.

Figure 4:
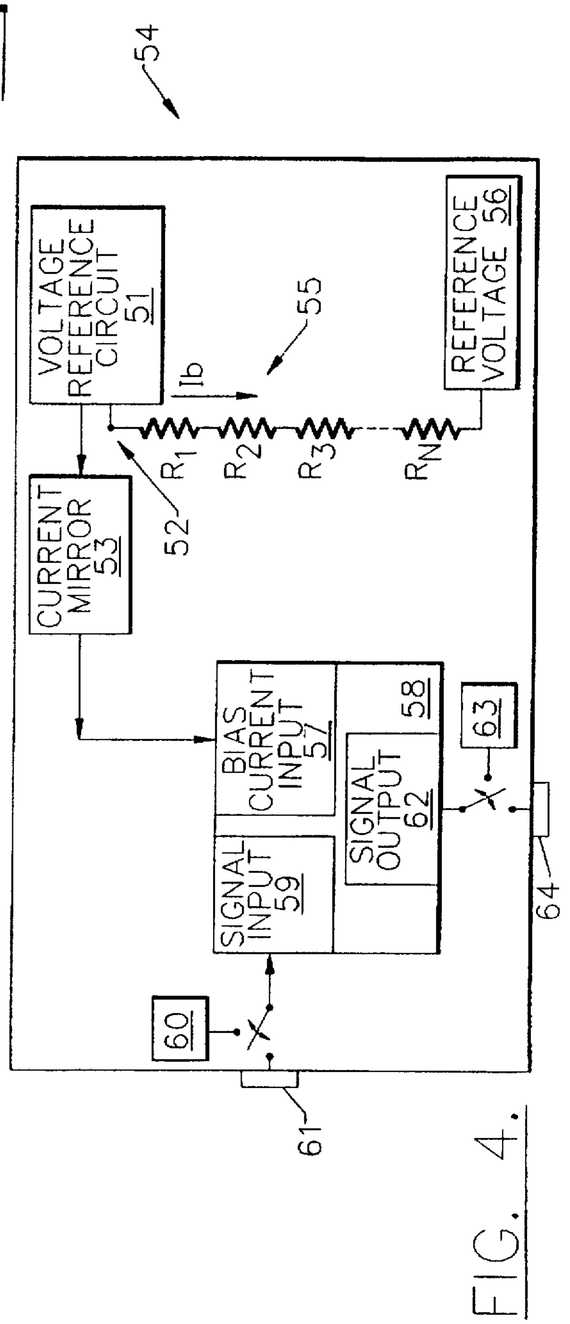
FIG. 4 illustrates a current generator according to a second embodiment of the invention.

Referring now to FIG. 4, another embodiment of the invention is shown. An integrated circuit 54 includes a voltage reference circuit 51, as well as a resistor ladder 55. The resistor ladder 55 is connected between an output voltage node 52 of the voltage reference circuit 51 and a reference voltage 56, which may be ground. A current $I_b$ is generated, as discussed above, and reflected by a current mirror 53. The current mirror 53 may then provide a bias current to a bias current input 57. The bias current input 57 may be electrically connected to any number of internal circuits 58 which require a stable bias current. Often, the internal circuit 58 will produce a specific output signal based on one or more bias currents $I_b$ and one or more signal inputs 59. The signal inputs 59 may be derived from a second internal circuit 60 or be provided to the IC 54 via an external pin 61. A signal output 62 may then be connected to a third internal circuit 63 for more signal processing or provide the output signal to another external pin 64. Those having skill in the will recognize the many variations that are possible with the present invention.

The present invention also includes a method for reliably producing current generators across wafer lots. A plurality of voltage reference circuits are formed in electrical connection with respective ones of a plurality of voltage ladders in a plurality of semiconductor die. Each voltage ladder is formed of a plurality of n different types of series-connected resistors. Preferably, the plurality of n statistically independent resistors are formed with each resistor of the plurality of statistically independent resistors having a predefined standard resistance deviation across manufacturing wafer lots. An output voltage from respective ones of the voltage reference circuits applied across respective ones of the plurality of n different types of resistors would produce a plurality of respective output currents. Each of the respective output currents preferably has a predefined standard current deviation across manufacturing wafer lots.

This invention should not be confused with the myriad circuit application efforts that have been made in the past to make a voltage reference, or other circuit, independent of temperature. That is, it has been known to place two resistors of different types in series. However, their use was generally limited to temperature compensation—not for manufacturability purposes. Referring again to FIG. 1, the transistor $T_2$ is arranged as an emitter follower, in the voltage reference circuit 51, which uses a resistor $R_A$. In the past, resistor $R_A$ may have been exchanged for two resistors of different types so that temperature changes, which may effect either resistor's value, would be somewhat offset by different temperature tracking coefficients. Choosing resistors of different types because they track temperatures differently, without thought as to their electrical and manufacturing independence, would not suggest or disclose the present invention.

This invention results in a very small variation in absolute resistor value for a plurality of resistors. The resulting current generator circuit 51 generates currents with improved absolute current tolerances over the expected range of manufacturing process variations. A reduced variation in absolute resistor values lowers the standard current deviation values. Consequently, circuits can take advantage of lower standard deviations in currents by using a higher current throughput as well as more accurate bias currents. The invention permits currents with low standard deviations in terms of absolute current levels and can yield currents with standard deviations having a predefined relationship to the standard deviation of a particular circuit element.

In the drawings and specification there have been disclosed typical preferred embodiments of the invention.

Although specific terms are employed, they are used in a generic and descriptive sense only and not for purposes of limitation. For example, although current outputs and bias currents are discussed, circuits which require a stable resistive load across manufacturing lots can also take advantage of the present invention. The scope of the invention is set forth in the following claims.

That which is claimed:

1. A monolithic current generator comprising:

a voltage reference circuit having an output voltage; and a resistor ladder electrically connected to said voltage reference circuit such that the output voltage is applied across said resistor ladder for compensating for process variations thereby producing an output current, said resistor ladder having a plurality of n statistically independent resistors electrically connected in series, said plurality of n statistically independent resistors having respective as-manufactured resistance values varied from respective target resistance mean values so that the as-manufactured resistance value for one resistor is generally independent of the as-manufactured resistance value for each other resistor, each of the n statistically independent resistors being selected according to:

$$\frac{\sigma_T}{r_T} = \sqrt{\sum_{i=1}^{n}\left(\frac{1}{x_i}\right)^2\left(\frac{\sigma_i}{r_i}\right)^2}$$

where $r_T$=total target resistance mean value of the resistor ladder;

$\sigma_T$=standard deviation of the total as-manufactured resistance value of the resistor ladder;

$x_i$=a number greater than one which represents the target resistance mean value of each statistically independent resistor, ri, as some fraction of the total target resistance mean value;

$\sigma_i$=standard deviation of the as-manufactured resistance value of the ith statistically independent resistor, $r_i$, in the resistor ladder; and where the target mean resistance value of each statistically independent resistor, $r_i$,=$r_T$/$x_i$.

2. A current generator according to claim 1 wherein all of the variables $x_i$ to $x_n$ are equal to a same number greater than one.

3. A monolithic current generator comprising:

a voltage reference circuit having an output voltage; and a resistor ladder having a plurality of statistically independent resistors electrically connected in series, said plurality of statistically independent resistors for compensating for process variations having respective as-manufactured resistance values varied from respective target resistance mean values so that the as-manufactured resistance value for one resistor is generally independent of the as-manufactured resistance value for each other resistor, said plurality of statistically independent resistors having a total as-manufactured resistance value with a predefined standard deviation, said resistor ladder being electrically connected to said voltage reference circuit such that the output voltage is applied across said resistor ladder thereby producing an as-manufactured output current having a predefined standard deviation being dependent on the predefined standard deviation of the total as-manufactured resistance value.

4. A current generator according to claim 3 wherein said plurality of statistically independent resistors comprises no more than six statistically independent resistors.

5. A current generator according to claim 3 wherein said plurality of statistically independent resistors are selected from the group consisting of diffused resistors, implanted resistors, thin film resistors, metal resistors, and composite resistors.

6. An integrated circuit comprising:

an internal circuit having a signal input, a signal output, and a bias current input, the signal output being responsive to an input signal at the signal input and a bias current at the bias current input;

a voltage reference circuit having an output voltage; and a resistor ladder having a plurality of statistically independent resistors electrically connected in series for compensating for process variations, said plurality of statistically independent resistors having respective as-manufactured resistance values varied from respective target resistance mean values so that the as-manufactured resistance value for one resistor is generally independent of the as-manufactured resistance value for each other resistor, said plurality of statistically independent resistors having a total as-manufactured resistance value with a predefined standard deviation, said resistor ladder being electrically connected to said voltage reference circuit and said internal circuit such that the output voltage is applied across said resistor ladder which thereby produces the bias current, the bias current being electrically provided to the bias current input, and wherein the as-manufactured bias current has a predefined standard deviation which is dependent on the predefined standard deviation of the total as-manufactured resistance value.

7. An integrated circuit according to claim 6 wherein said plurality of statistically independent resistors comprises no more than six statistically independent resistors.

8. An integrated circuit according to claim 6 wherein said plurality of statistically independent resistors are selected from the group consisting of diffused resistors, implanted resistors, thin film resistors, metal resistors, and composite resistors.

9. An integrated circuit comprising:

an internal circuit having a signal input, a signal output, and a bias current input, the signal output being affected by an input signal at the signal input and a bias current at the bias current input;

a voltage reference circuit having an output voltage; and a resistor ladder having a plurality of different types of resistors electrically connected in series for compensating for process variations, said plurality of different types of resistors being selected from the group consisting of diffused resistors, implanted resistors, thin film resistors, metal resistors, and composite resistors, said resistor ladder being electrically connected to said voltage reference circuit and said internal circuit such that the output voltage is applied across said resistor ladder which thereby produces the bias current, the bias current being electrically provided to the bias current input.

10. A current generator according to claim 9 wherein said plurality of different types of resistors comprise a plurality of statistically independent resistors, said plurality of statistically independent resistors having respective as-manufactured resistance values varied from respective target resistance mean values so that the as-manufactured resistance value for one resistor is generally independent of the as-manufactured resistance value for each other resistor, each of said plurality of statistically independent resistors having an as-manufactured resistance value with a predefined standard deviation.

11. An integrated circuit according to claim 9 wherein said plurality of different types of resistors comprises no more than six different types of resistors.

12. A monolithic current generator comprising:

a voltage reference circuit having an output voltage; and a plurality of different types of resistors electrically connected in series for compensating for process variations, said plurality of different types of resistors being selected from the group consisting of diffused resistors, implanted resistors, thin film resistors, metal resistors, and composite resistors, said plurality of different types of resistors being electrically connected to said voltage reference circuit such that the output voltage is applied across said plurality of different types of resistors and thereby produces an output current.

13. A current generator according to claim 12 wherein said plurality of different types of resistors comprise a plurality of statistically independent resistors having respective as-manufactured resistance values varied from respective target resistance mean values so that the as-manufactured resistance value for one resistor is generally independent of the as-manufactured resistance value for each other resistor, each of said plurality of statistically independent resistors having an as-manufactured resistance value with a predefined standard deviation.

14. A current generator according to claim 12 wherein said plurality of different types of resistors comprises no more than six different types of resistors.

15. A method for ensuring reproducible and accurate current outputs in current generators manufactured in different wafer lots comprising the steps of:

providing a semiconductor wafer having a plurality of semiconductor die;

forming a plurality of voltage reference circuits in the plurality of semiconductor die;

forming a plurality of n different types of resistors electrically connected in series for each of the respective plurality of voltage reference circuits in the plurality of semiconductor die said plurality of n different types of resistors being selected from the group consisting of diffused resistors, implanted resistors, thin film resistors, metal resistors, and composite resistors; and forming an electrical connection between each of the plurality of voltage reference circuits and each of the plurality of n different types of resistors such that an output voltage from respective ones of the voltage reference circuits applied across each of the respective plurality of n different types of resistors would produce a plurality of respective output currents.

16. A method according to claim 15 wherein the step of forming a plurality of n different types of resistors comprises the step of forming a plurality of n statistically independent resistors having respective as-manufactured resistance values varied from respective target resistance mean values so that the as-manufactured resistance value for one resistor is generally independent of the as-manufactured resistance value for each other resistor, each resistor of said plurality of statistically independent resistors having an as-manufactured resistance value with a predefined standard deviation across manufacturing wafer lots.

17. A method according to claim 15 wherein the step of forming a plurality of n different types of resistors comprises the step of forming a plurality of statistically independent resistors having respective as-manufactured resistance values varied from respective target resistance mean values so that the as-manufactured resistance value for one resistor is generally independent of the as-manufactured resistance value for each other resistor, the plurality of n statistically independent resistors having a total as-manufactured resistance value with a predefined standard deviation across manufacturing wafer lots.

18. A method according to claim 15 wherein the step of forming a plurality of n different types of resistors comprises the step of forming no more than six different types of resistors electrically connected in series for each of the respective plurality of voltage reference circuits formed in the plurality of semiconductor die.

19. A method according to claim 15 and further comprising the steps of providing an output voltage from respective ones of the voltage reference circuits across each of the respective plurality of n different types of resistors to produce a plurality of respective as-manufactured output currents each having a predefined standard deviation across manufacturing wafer lots.

20. A method according to claim 19 and further comprising the steps of:

forming a plurality of circuits having current inputs in the plurality of semiconductor die; and providing the plurality of respective output currents to the plurality of current inputs in the plurality of semiconductor die.

21. A method for ensuring reproducible and accurate currents in different wafer lots comprising the steps of:

providing a semiconductor wafer having a plurality of semiconductor die, each die comprising a voltage reference circuit; and forming a plurality of n statistically independent resistors in each of the voltage reference circuits of the plurality of semiconductor die to thereby define current generators, the plurality of n statistically independent resistors having respective as-manufactured resistance values varied from respective target resistance mean values so that the as-manufactured resistance value for one resistor is generally independent of the as-manufactured resistance value for each other resistor and having a total as-manufactured resistance value with a predefined standard deviation across manufacturing wafer lots.

22. A method according to claim 21 wherein the step of forming a plurality of n different types of statistically independent resistors comprises the step of forming no more than six statistically independent resistors electrically connected in series in the plurality of semiconductor die.

23. A method according to claim 21 wherein the step of forming a plurality of n different types of statistically independent resistors comprises the step of forming a plurality of n different types of statistically independent resistors selected from the group consisting of diffused resistors, implanted resistors, thin film resistors, metal resistors, and composite resistors.

24. A method according to claim 21 wherein the step of forming a plurality of n different types of statistically independent resistors comprises the step of forming a plurality of n different types of statistically independent resistors, each of said plurality of statistically independent resistors being selected according to:

$$\frac{\sigma_T}{r_T} = \sqrt{\sum_{i=1}^{n} \left(\frac{1}{x_i}\right)^2 \left(\frac{\sigma_i}{r_i}\right)^2}$$

where $r_T$=total target resistance mean value of the resistor ladder;

$\sigma_T$=standard deviation of the total as-manufactured resistance value of the resistor ladder across manufacturing wafer lots;

$x_i$=a number greater than one which represents the target resistance mean value of each statistically independent resistor, ri, as some fraction of the total target resistance mean value;

$\sigma_i$=standard deviation of the as-manufactured resistance value of the ith statistically independent resistor, $r_i$, in the resistor ladder across manufacturing wafer lots; and where the target mean resistance value of each statistically independent resistor, $r_i$,$=r_T/x_i$.

25. A monolithic current generator according to claim 1 wherein said plurality of statistically independent resistors comprises a plurality of different types of resistors being selected from the group consisting of diffused resistors, implanted resistors, thin film resistors, metal resistors, and composite resistors.

* * * * *

UNITED STATES PATENT AND TRADEMARK OFFICE
CERTIFICATE OF CORRECTION

PATENT NO. : 5,701,097
DATED : December 23, 1997
INVENTOR(S) : Gregroy J. Fisher, and Chong I. Chi It is certified that error appears in the above-identified patent and that said Letters Patent is hereby corrected as shown below:

Column 6, Line 49 Delete:

"NiCr32 8.9%"

Insert:

– NiCr – 8.9% –

Signed and Sealed this

Fourteenth Day of April, 1998

*Attest:*

BRUCE LEHMAN

*Attesting Officer* *Commissioner of Patents and Trademarks*